(12) United States Patent
Koga

(10) Patent No.: US 6,841,827 B2
(45) Date of Patent: Jan. 11, 2005

(54) SEMICONDUCTOR MEMORY DEVICE

(75) Inventor: Masayuki Koga, Gifu (JP)

(73) Assignees: Sanyo Electric Co., Ltd., Moriguchi (JP); Tottori Sanyo Electric Co., Ltd., Tottori (JP)

( * ) Notice: Subject to any disclaimer, the term of this patent is extended or adjusted under 35 U.S.C. 154(b) by 0 days.

(21) Appl. No.: 10/210,181

(22) Filed: Aug. 2, 2002

(65) Prior Publication Data

US 2003/0038322 A1 Feb. 27, 2003

(30) Foreign Application Priority Data

Aug. 3, 2001 (JP) ........................................ 2001-236432

(51) Int. Cl.[7] .......................... H01L 27/12; G11C 17/00
(52) U.S. Cl. ........................ 257/350; 257/347; 365/104
(58) Field of Search ........................ 257/347, 350–351; 365/104

(56) References Cited

U.S. PATENT DOCUMENTS 4,128,773 A * 12/1978 Troutman et al. ...... 365/185.07
5,640,040 A * 6/1997 Nakagawa et al. ......... 257/487
5,648,277 A * 7/1997 Zhang et al. ................ 438/151
5,856,689 A * 1/1999 Suzawa ....................... 257/296
6,518,594 B1 * 2/2003 Nakajima et al. ............ 257/59

* cited by examiner

Primary Examiner—Allan R. Wilson
(74) Attorney, Agent, or Firm—Morrison & Foerster LLP

(57) ABSTRACT

Information is not written in through channel dope, but through the difference of ions implanted into the impurity region of a semiconductor layer. Each memory element has a pair of the thin film transistors. The memory element with "1" written on it and the memory element with "0" written on it are differentiated based on whether the thin film transistors of the pair belongs to the same conductivity type or different conductivity types. Also, when the write-in impurity region is formed adjacent the impurity region, it is possible to differentiate the memory elements based on whether a diode connected to the thin film transistor in series is formed or not. Since these elements can be produced without the ion-implantation through the gate electrode, it is possible to build a mask ROM on the glass substrate. Also, it is possible to differentiate the memory elements based on whether wiring contact holes are formed in the thin film transistor or not. This invention enables the formation of the memory element on the glass substrate to fabricate a mask ROM.

11 Claims, 7 Drawing Sheets

[1]

[0]

[1]

[0]

[1]

[0]

[1]

[0]

[1]

[0]

[1]

[0]

[1]

[0]

SEMICONDUCTOR MEMORY DEVICE

BACKGROUND OF THE INVENTION

1. Field of the Invention

This invention relates to a semiconductor memory device, specifically to a mask ROM formed on an insulating substrate such as glass.

2. Description of the Related Art

Mask ROM is a kind of semiconductor memory devices and a read-only memory for writing program during transistor manufacturing process. A plurality of memory elements is placed. Some memory elements are the transistors which become conductive when a gate voltage VG is applied. Other memory elements do not become conductive when the gate voltage VG is applied. A program is written into the memory element by using these different features of the elements. FIGS. 11A and 11B are the cross-sectional view of a typical memory element for the mask ROM. FIG. 11A shows a memory element 100 with "1" written on it, and FIG. 11B shows a memory element 101 with "0" written on it.

A gate insulating film 103, on which a gate electrode 104 is formed, is disposed on a semiconductor substrate 102. In the semiconductor substrate corresponding to both ends of the gate electrode 104, impurities, such as arsenic, boron, and phosphorus, are implanted, forming an impurity region 105. This configuration described above can be commonly used whether program is to be written or not. In the memory element, to which the information "0" is to be written, high concentration impurities with an opposite conductivity type from the impurity region 105 are implanted to a channel, forming a channel dope region 106. The following description assumes that phosphorus ions, an n-type impurity, are implanted into the impurity region 105.

The memory element 100 with "1" written on it is a transistor. When the gate voltage VG is applied to the gate electrode 104 by an address decoder, a channel is formed in the semiconductor substrate 102 directly underneath the gate electrode 104 and the memory element becomes conductive. When a read-out voltage VR is applied to one impurity region 105a, an output voltage Vout is outputted from the other impurity region 105b. On the other hand, in the memory element 101 with "0" written on it, the channel dope region 106 is formed, making the threshold value very high. It does not become conductive when the gate voltage VG is applied. Therefore, the voltage of the impurity region 105d does not change when the read-out voltage VR is applied to the other impurity region 105c.

Next, the manufacturing method of the mask ROM will be explained. The semiconductor substrate 100 is heated at 1000° C. or higher in oxygen atmosphere. The surface of the semiconductor substrate 100 is oxidized by about 10 nm by thermal oxidation, forming the gate oxidation film 103. Then, a metal film is formed on the gate oxidation film 103 by sputtering of a metal such as chrome and a predetermined area is removed by etching, forming the gate electrode 104. Next, the impurity regions 105a, 105b are formed by implanting phosphorus ion with the gate electrode 104 used as a mask. The process described above can be used regardless of the program to be written in. Then, a mask is formed on the memory element 100, to which bit data is not to be written. Also, in the memory element 101, in which bit data is to be written, a well 106 is formed by implanting boron ions into the semiconductor substrate 102 through the gate electrode 104 and the gate oxidation film 103. Accordingly, a program is written in the memory device.

In the manufacturing processes of the mask ROM, the process for program writing should be scheduled closer to the end of the processes as much as possible. The most preferable way to write the program into the mask ROM is to perform the program writing according to usage of semiconductor chips. Therefore, the semiconductor device, on which all the manufacturing processes other than program writing are done, should be stored till the usage of the device is determined. Then, when the usage of the device is determined, the program writing is performed to the stored device. In this way, the TAT (Turn Around Time), from the preparation of the program to the completion of the mask ROM, can be minimized.

There has been a demand for the mask ROM formed together with a TFT array on a glass substrate for a use in a liquid crystal display device, an image-reading device using TFT and a finger print-reading device using TFT. However, it is difficult to form the memory element on the glass substrate by the manufacturing method of the mask ROM described above, because the softening point of the glass used as a substrate is about 700° C. Therefore, it is impossible to form the gate insulating film 103 through thermal oxidation. The gate insulating film needs to be formed through chemical vapor deposition (CVD) method. However, since the insulating film formed by CVD method has a relatively coarse particle density and a low insulating capability in comparison to the thermally oxidized film, the thickness of the film needs to be about 100–400 nm. The thickness of the gate electrode is about 350 nm. But the polycrystalline silicon film is very thin, with the thickness of about 40–50 nm. Therefore, it is difficult to perform the ion implantation into the thin silicon film through the thick gate electrode and the gate insulating film.

SUMMARY OF THE INVENTION

This invention is directed to a mask ROM memory element formed on a glass substrate.

In a semiconductor memory device of this invention, a plurality of memory elements are disposed and one-bit data is written by using the difference in the conductivity characteristics among the memory elements. The memory element has a pair of thin film transistors having an active layer and a gate electrode facing to the active layer with a gate insulating film between them. The thin film transistors of the pair are connected to each other in series. A gate voltage is commonly inputted to the gate electrode. The memory element stores the one-bit data, depending on whether the thin film transistors of the pair belong to the same conductivity type, or the thin film transistors belong to different conductivity types.

In another semiconductor memory device of this invention, a plurality of memory elements are disposed and one-bit data is written using the difference in the conductivity characteristics among the memory elements. The memory element has a thin film transistor having an active layer, a gate electrode facing to the active layer with a gate insulating film between them, an impurity region formed at both ends of the active layer facing to the gate electrode, and a write-in impurity region disposed adjacent to the impurity region of the thin film transistor. The memory element stores the one-bit data, depending on whether the write-in impurity region belongs to the same conductivity type as the impurity region of the thin film transistor.

In yet another semiconductor memory device of this invention, a plurality of memory elements are disposed and one-bit data is written using the difference in the conductivity characteristics among the memory elements. The memory element has a thin film transistor having an active layer, a gate electrode facing to the active layer with a gate insulating film between them, and an impurity region formed at both ends of the active layer facing to the gate electrode. The memory element stores the one-bit data, depending on whether a diode is formed at one end of the thin film transistor.

In yet another semiconductor memory device of this invention, a plurality of memory elements are disposed and one-bit data is written using the difference in the conductivity characteristics among the memory elements. The memory element has a thin film transistor having an active layer, a gate electrode facing to the active layer with a gate insulating film between them, and an impurity region formed at both ends of the active layer facing to the gate electrode. The memory element stores 2-bit data. Specifically, the memory element stores a first value when a diode with normal direction is formed at one end of the thin film transistor, the memory element stores a second value when the diode with reversed direction is formed at the other end of the thin film transistor, the memory element stores a third value when the diode with normal direction and the diode with reversed direction are formed at the both ends of the thin film transistor, and the memory element stores a forth value when diode is not formed at the both ends of the thin film transistor.

In yet another semiconductor memory device of this embodiment, a plurality of memory elements are disposed and one-bit data is written using the difference in the conductivity characteristics among the memory elements. The memory element has a thin film transistor having an active layer, a gate electrode facing to the active layer with a gate insulating film between them, an interlayer insulating film, an impurity region formed at both ends of the active layer facing to the gate electrode, and a pair of wirings disposed corresponding to the impurity region of the thin film transistor. The memory element stores the one-bit data, depending on whether the wiring is connected to the impurity region of the thin film transistor.

Furthermore, the active layer of the thin film transistor is a semiconductor film formed on a glass substrate.

DETAILED DESCRIPTION OF THE INVENTION

Figure 1A:
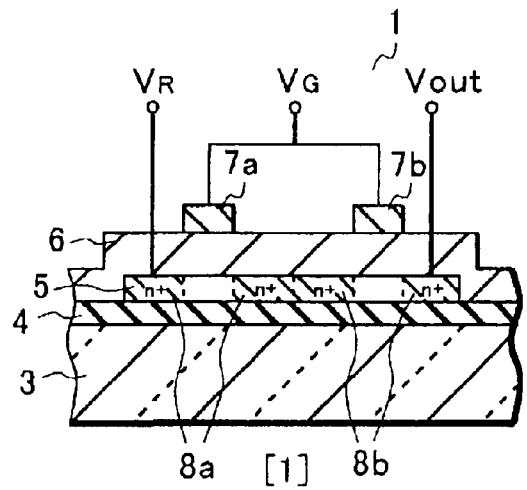
FIGS. 1A and 1B are cross-sectional views of a first embodiment of the semiconductor memory element of this invention.
Figure 1B:
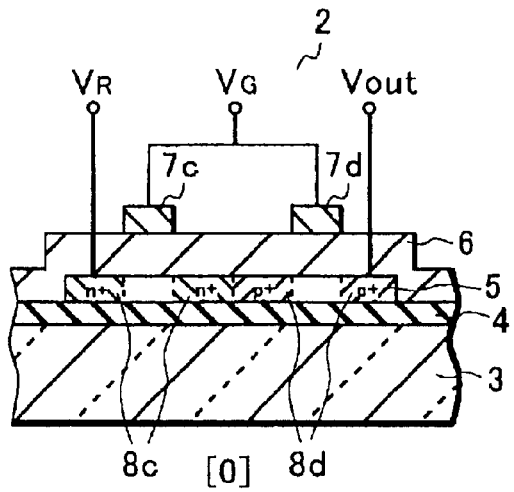
Figure 2A:
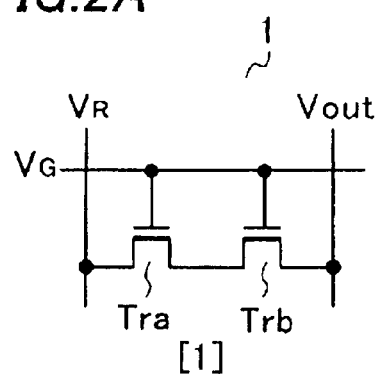
FIGS. 2A and 2B show equivalent circuits of the first embodiment of the semiconductor memory element of this invention.
Figure 2B:
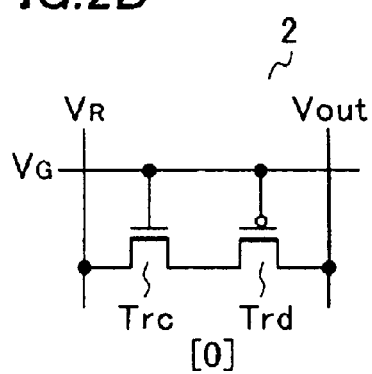

FIGS. 1A and 1B are cross-sectional views of a first embodiment of the semiconductor memory element of this invention. FIGS. 2A and 2B show corresponding equivalent circuit. FIG. 1A and FIG. 2A indicate a memory element 1 with "1" written on it. FIG. 1B and FIG. 2B indicate a memory element 2 with "0" written on it. The memory elements 1 and 2 respectively has a pair of thin film transistors Tra, Trb, and Trc, Trd connected in series to each other. As to each of the thin film transistors, a buffer layer 4, an active layer 5 made of polycrystalline silicon, a gate insulating film 6 and gate electrode 7a, 7b, 7c, or 7d are consecutively disposed on a glass substrate 3. At the both ends of the active layers corresponding to the respective gate electrodes 7a, 7b, 7c, 7d, impurities are implanted to form impurity regions 8a, 8b, 8c, and 8d. A pair of transistors (Tra and Trb, or Trc and Trd) is formed as one unit at the active layer 5. A common gate voltage VG is applied to each of the pairs of gate electrodes, the pair of 7a, 7b and the pair of 7c, 7d. A read-out voltage VR is applied to one of the each impurity regions 8a or 8c of the first thin film transistors. The other impurity region 8a is connected to the impurity region 8b and the other impurity region 8c to the impurity region 8d of the second thin film transistors respectively, forming one unit respectively. From the other impurity regions 8b and 8d of the second thin film transistors, an output voltage Vout is outputted.

In the memory element 1 with "1" written on it, the first thin film transistor Tra and the second thin film transistor Trb are both n-channel type. The conductivity type of the impurity region 8a of the first thin film transistor Tra is n-type with phosphorus implanted, and the conductivity type of the impurity region 8b of the second thin film transistor Trb is also n-type with phosphorus implanted. Therefore, in the memory element 1 with "1" written on it, the first and second thin film transistors Tra and Trb turn on and off simultaneously. When the gate voltage VG becomes high, entire region of the active layer 5 becomes conductive, outputting the output voltage Vout corresponding to the read-out voltage VR.

In the memory element 2 with "0" written on it, the first thin film transistor Trc is n-channel type and the second thin film transistor Trd is p-channel type. The conductivity type of the impurity region 8c of the first thin film transistor Trc is n-type with phosphorus implanted, and the conductivity type of the impurity region 8d of the second thin film transistor Trd is p-type with boron implanted. Therefore, in the memory element 2, the first and second thin film transistors Trc and Trd turn on and off complimentarily. The entire active layer 5 does not become conductive, regardless of the height of the gate voltage VG Therefore, even if the reading voltage VR becomes high, the output voltage Vout does not change.

Based on the difference in Vout between the memory elements, respective information is read out.

Next, the manufacturing method of the first embodiment of the semiconductor memory device of this invention will be explained. The buffer layer comprising an oxidized silicon film and a nitride silicon film disposed by CVD method as well as an amorphous silicon film are formed on the glass substrate 3. Then, a polycrystalline silicon layer is formed by crystallizing the amorphous silicon film through irradiation of eximer laser. For the appropriate crystallization of the amorphous silicon film, the thickness of the amorphous silicon film should be about 40–50 nm. Then, a predetermined region of the polycrystalline silicon film is removed through etching, forming the active layer 5. Next, by using CVD method, the gate insulating film of about 400 nm in thickness covering the active layer 5 is formed. Then, a metal such as chrome is sputtered to the entire surface, forming a metal film of 350 nm in thickness. By removing the predetermined area through etching, the gate electrode 7 is formed. Above processes can be used regardless of the program to be written in. Next, according to the program to be written in, a mask is formed on the second thin film transistor Trd of the memory element 2 with "0" to be written in. Then, in the pair of the thin film transistors Tra and Trb of the memory element 1 with "1" to be written in and in the active layer 5 of the first thin film transistor Trc of the memory element 2 with "0" to be written in, phosphorous ions are implanted with an energy of about 60 keV and a density of about $10^{15}$ cm$^{-2}$. Then, a mask is formed on the pair of the thin film transistors Tra and Trb of the memory element 1 with "1" to be written in and on the first thin film transistor Trc of the memory element 2 with "0" to be written in. Then, boron ions are implanted, with an energy of about 15 keV and a density of about $10^{15}$ cm$^{-2}$, in the active layer 5 of the second thin film transistor Trd of the memory element 2 with "0" to be written in. This method produces the semiconductor memory device of this embodiment.

In this embodiment, the program writing is not performed by the channel dope through the gate electrode 7 and the gate insulating film 6, but rather by the ion implantation to the impurity performed only through the gate insulating film 6. Since the thickness of the film, which the implanted ion goes through, is very thin, the mask ROM using the thin film transistor on glass substrate is achieved.

Figure 3A:
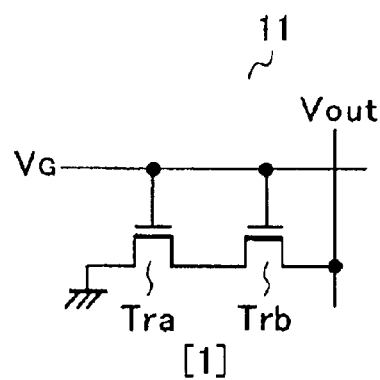
FIGS. 3A and 3B show equivalent circuits of a second embodiment of the semiconductor memory element of this invention.
Figure 3B:
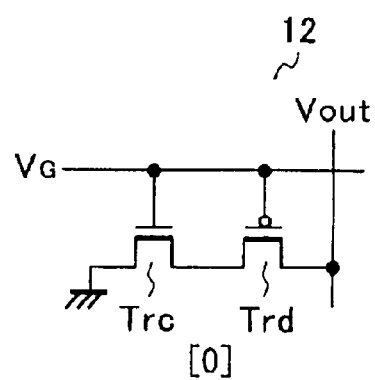

Next, the equivalent circuit of a second embodiment of the memory element of this invention will be explained by referring to FIGS. 3A and 3B. FIG. 3A indicates a memory element 11 with "1" written on it, and FIG. 3B indicates a memory element 12 with "0" written on it. The cross-sectional view and the configuration of this embodiment are the same as those of the first embodiment. Therefore, the explanation on the configuration and the cross-sectional view of the second embodiment will be omitted. This embodiment differs from the first embodiment in that a pair of thin film transistors configuring the memory element is connected in series between the read-out line Vout and a ground voltage.

The first thin film transistor Tra and the second thin film transistor Trb of the memory element 11 with "1" written on it are both n-channel type. Therefore, in the memory element 11, the first and second thin film transistors turn on and off simultaneously. On the other hand, the first thin film transistor Trc of the memory element 12 with "0" written on it is n-type and the second thin film transistor Trd is p-type. Therefore, in the memory element 12, the first and second thin film transistors turn on and off complimentarily.

The read-out method of the memory element of this embodiment will be explained. First, the read-out line Vout is pre-charged with the predetermined voltage when the gate voltage is low. Then, the first and second thin film transistors Tra and Trb of the memory element 11 with "1" written on it turn on simultaneously when the gate voltage VG becomes high, connecting the read-out line Vout to the ground voltage. Therefore, the voltage of the read-out line Vout drops from the pre-charged voltage to 0 volt. On the other hand, the voltage of the read-out line does not drop in the memory element 12 with "0" written on it, because the p-channel thin film transistor Trd is off when the voltage becomes high. The output voltage Vout corresponding to the content of each of the memory elements is obtained by returning the gate voltage VG to low and reading out the voltage of the read-out line Vout. The output voltage Vout can be obtained keeping the gate voltage VG high without returning the gate voltage VG to low.

Figure 4A:
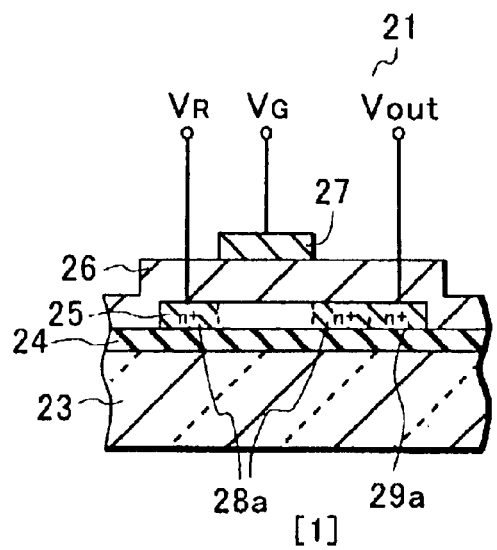
FIGS. 4A and 4B are cross-sectional views of a third embodiment of the semiconductor memory element of this invention.
Figure 4B:
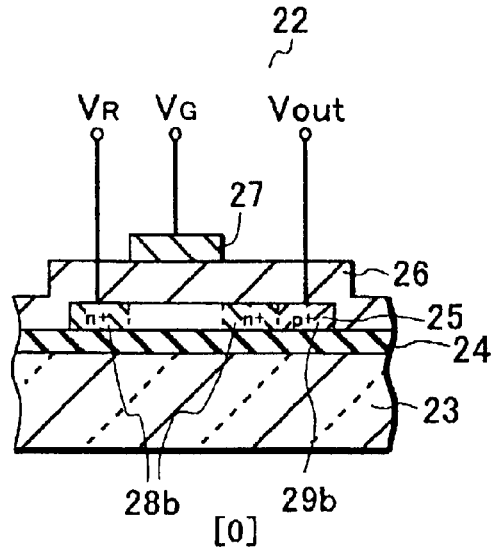
Figure 5A:
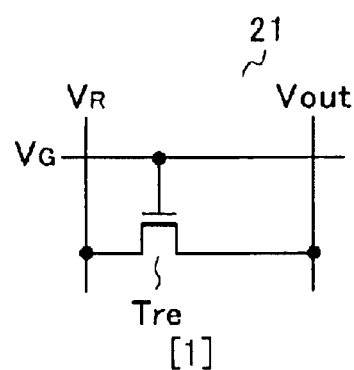
FIGS. 5A and 5B show equivalent circuits of the third embodiment of the semiconductor memory element of this invention.
Figure 5B:
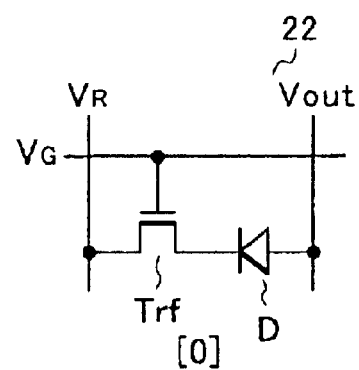

Next, the cross-sectional views of a third embodiment of the semiconductor memory element of this invention are shown in FIGS. 4A and 4B. Also, corresponding equivalent circuits are shown in FIGS. 5A and 5B. FIGS. 4A and 5A indicate a memory element 21 with "1" written on it and FIGS. 4B and 5B indicate a memory element 22 with "0" written on it. The memory elements 21 and, 22 of this embodiment both have a thin film transistor and a write-in impurity regions 29a and 29b located adjacent to impurity regions 28a and 28b, respectively. The buffer layer 24, the active layer 25 made of polycrystalline silicon, the gate insulating film 26, and the gate electrode 27 are disposed consecutively on the glass substrate 23, completing the thin film transistor. Impurities are implanted into both ends of each of the active layers 25 corresponding to the respective gate electrodes 27, configuring the impurity regions 28a and 28b respectively. Also, the write-in impurity regions 29a and 29b are placed adjacent to the impurity regions 28a and 28b.

The thin film transistor Tre of the memory element 21 with "1" written on it is an n-channel-type. The conductivity type of the impurity region 28a of this thin film transistor Tre is an n-type with phosphorous implanted and the conductivity type of the write-in impurity region 29a is also n-type with phosphorous implanted. Therefore, the equivalent circuit of the memory element 21 simply contains the thin film transistor Tre only. Thus, the active layer 25 becomes conductive and the output voltage Vout corresponding to the read-out voltage VR is outputted when the gate voltage VG becomes high.

The thin film transistor Trf of the memory element 22 with "0" written on it is an n-channel type. The conductivity type of the impurity region 28b of this thin film transistor Trf is an n-type with phosphorous implanted but the conductivity type of the write-in impurity region 29b is p-type with boron implanted. Therefore, a pn-junction is made of the impurity regions 28b and 29b. Thus, as shown in FIG. 5B, the thin film transistor Trf and the diode formed in the opposite direction are connected in series in the equivalent circuit of the memory element 22. Therefore, when the thin film transistor Trf becomes conductive with the gate voltage VG being high, it does not become conductive because of the presence of the diode. Thus, the output voltage Vout does not change when the read-out voltage VR becomes high.

The memory elements 21, 22 of this embodiment are formed in the same way as that of the first embodiment, where layers up to the gate electrode 27 are disposed consecutively. Then, ion implantation into the active layer 25 through the gate insulating film 26 is performed for writing a program. The program writing is not performed by the channel dope through the gate electrode 27 and the gate insulating film 26, but rather by implanting the impurity ions into the impurity regions only through the gate insulating film 26. Since the thickness of the film, which the implanted ion goes through, is very thin, as in the first embodiment, the mask ROM using the thin film transistor on glass substrate can be achieved. Since only one thin film transistor is required in this embodiment, the size of the area the element takes up can be smaller compared to the first embodiment. However, there is a higher possibility of electric current leakage than the first embodiment. Pin junction or P-N⁻-N⁺ junction instead of the pn junction can be used to decrease the leakage.

Figure 6A:
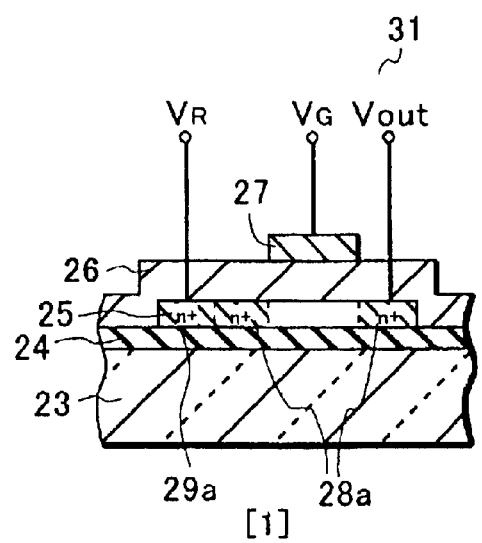
FIGS. 6A and 6B are cross-sectional views of a forth embodiment of the semiconductor memory element of this invention.
Figure 6B:
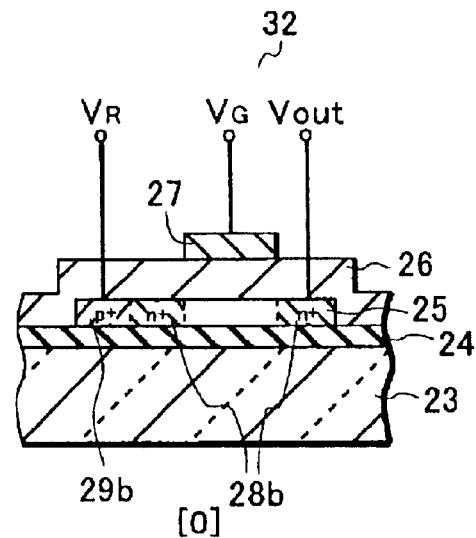
Figure 7A:
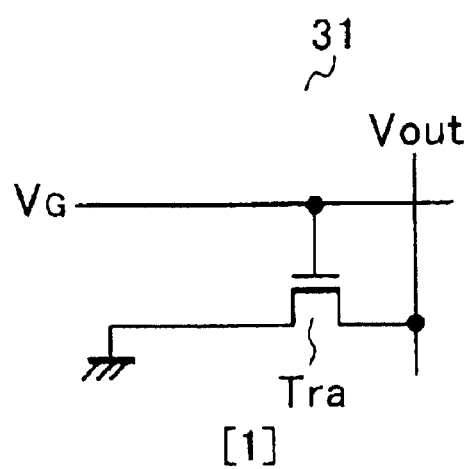
FIGS. 7A and 7B show equivalent circuits of the forth embodiment of the semiconductor memory element of this invention.
Figure 7B:
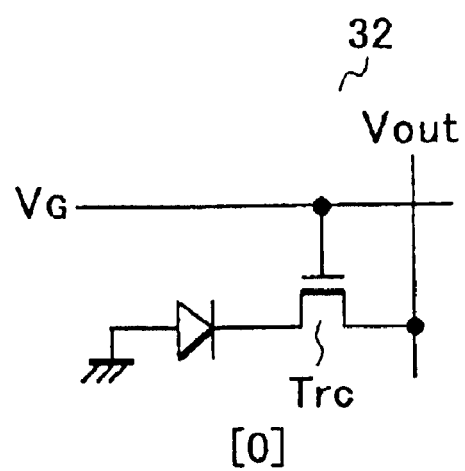

Next, cross-sectional views of a forth embodiment of the semiconductor memory element of this invention are shown in FIGS. 6A and 6B. Also, corresponding equivalent circuits are shown in FIGS. 7A and 7B. FIGS. 6A and 7A indicate a memory element 31 with "1" written on it, and FIGS. 6B and 7B indicate a memory element 32 with "0" written on it. The configuration of this embodiment is similar to that of the third embodiment. Therefore, the redundant explanation on the configuration will be omitted. This embodiment differs from the third embodiment in that the thin film transistor and the write-in impurity region are connected in series between the read-out line Vout and the ground voltage. Also, the direction of the diode placed for the memory element 32, in which the one-bit data is not to be written, is different from that in the third embodiment.

The read-out method of the memory element of this embodiment will be explained. First, the read-out line Vout is pre-charged with a predetermined voltage when the gate voltage VG is low. When the gate voltage VG becomes high, the thin film transistor Tra in the memory element 31 with "1" written on it turns on, grounding the read-on line Vout to the ground voltage. Therefore, the voltage of the read-out line Vout drops from the pre-charged voltage to 0 volt. On the other hand, in the memory element 32 with "0" written on it, the voltage of the read-out line does not drop when the gate voltage 32 becomes high, because there is the diode D in the reversed direction. The output voltage Vout corresponding to the content of each of the memory elements is obtained by making the gate voltage VG low and reading out the voltage of the read-out line Vout. The output voltage Vout can be obtained by keeping the gate voltage VG high.

A fifth embodiment of this invention will be explained next with reference to FIGS. 8A–8D. The memory element of this embodiment stores the two-bit information. Each of the memory elements 41, 42, 43, and 44 of this embodiment has a thin film transistor and a write-in impurity regions placed adjacent to both ends of the impurity region. The buffer layer 46, the active layer 47 made of polycrystalline silicon, the gate insulating film 48, and the gate electrode 49 are disposed consecutively on the glass substrate 45, completing the thin film transistor. Impurities are implanted into the both ends of each of the active layers 47 corresponding to the respective gate electrodes, configuring the impurity regions 50. Also, the write-in impurity regions 51 are placed adjacent to the both ends of the impurity region 50.

The memory elements 41, 42, 43, and 44 of this embodiment are formed in the same way as that of the first embodiment, where the layers up to the gate electrode 49 are disposed consecutively. Then, ion implantation into the active layer 47 through the gate insulating film 48 is performed for program writing. The program writing is not performed by the channel dope through the gate electrode 49 and the gate insulating film 48, but rather by implanting the impurity ions into the impurity regions only through the gate insulating film 48. Since the thickness of the film, which the implanted ion goes through, is very thin, as in the first embodiment, the mask ROM using the thin film transistor on glass substrate can be achieved.

Figure 9A:
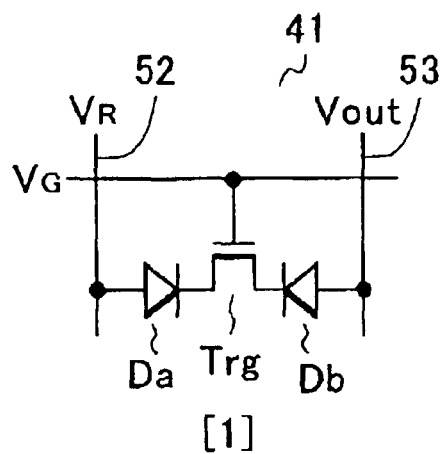
FIGS. 9A, 9B, 9C and 9D show equivalent circuits of the fifth embodiment of the semiconductor memory element of this invention.

The read-out method of this embodiment will be explained. In the memory element 41 shown in FIGS. 8A and 9A, the write-in impurity regions 51a and 51b at the both ends are p-type with boron doped. Therefore, at the both ends of the thin film transistor Trg, the diodes Da and Db having the opposite directions from each other are formed. Thus, it does not become conductive when the gate voltage Vg becomes high regardless of the direction of the electric current.

Figure 8A:
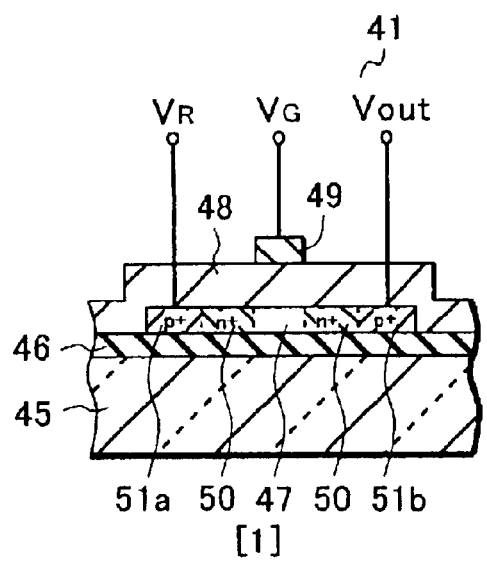
FIGS. 8A, 8B, 8C, and 8D are cross-sectional views of a fifth embodiment of the semiconductor memory element of this invention.
Figure 8B:
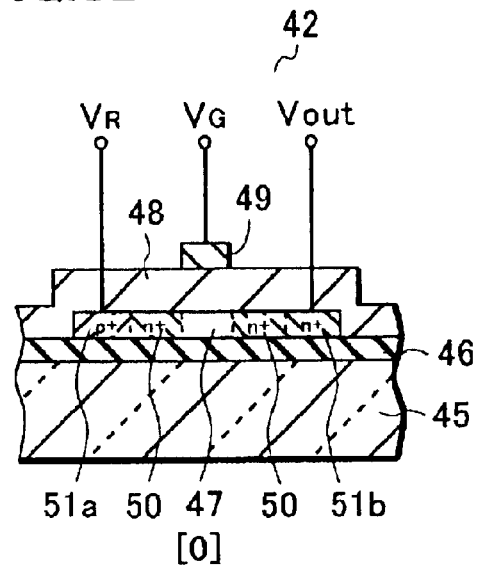
Figure 9B:
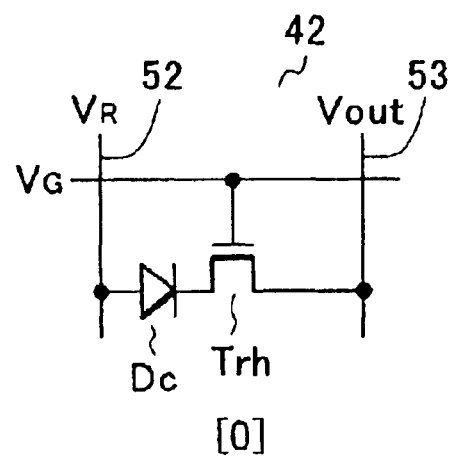

In the memory element 42 shown in FIGS. 8B and 9B, the write-in impurity region 51a at the left end is p-type with boron implanted and the write-in impurity region 51b at the right end is n-type with phosphorous implanted. Therefore, at the left side of the thin film transistor Trh, the rightward diode Dc is formed. When the read-out voltage VR higher than that of the signal line 53 is applied to the signal line 52, the diode Dc is biased in the normal direction and the rightward electric current goes through. Then, the output voltage Vout corresponding to the read-out voltage VR is outputted to the signal line 53. On the other hand, when the read-out voltage VR higher than that of the signal line 52 is applied to the signal line 53, the diode Dc is biased in the reverse direction and the leftward electric current does not go through. Therefore, the output voltage Vout of the signal line 52 does not change when the read-out voltage VR of the signal line 53 becomes high.

Figure 8C:
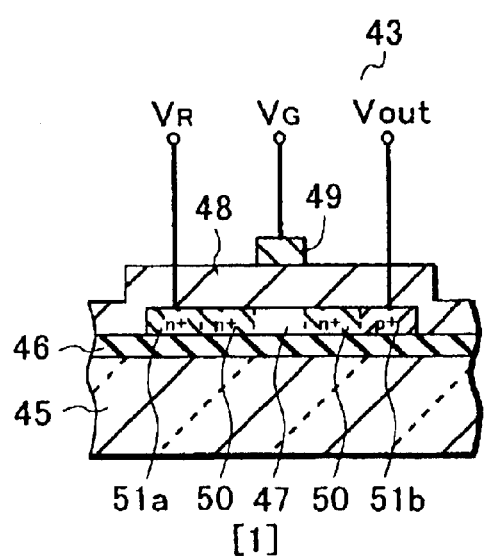
Figure 9C:
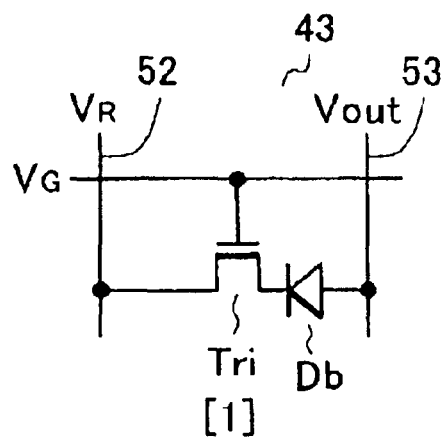

By the same token, the memory element 43 shown in FIGS. 8C and 9C becomes conductive only in the left direction. Therefore, the output voltage Vout of the signal line 53 does not change when the read-out voltage VR is applied to the signal line 52. The corresponding output voltage Vout is outputted from the signal line 52 when the read-out voltage VR is applied to the signal line 53.

Figure 8D:
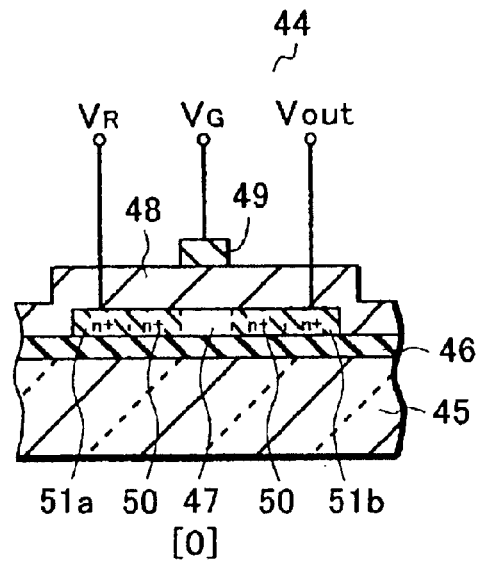
Figure 9D:
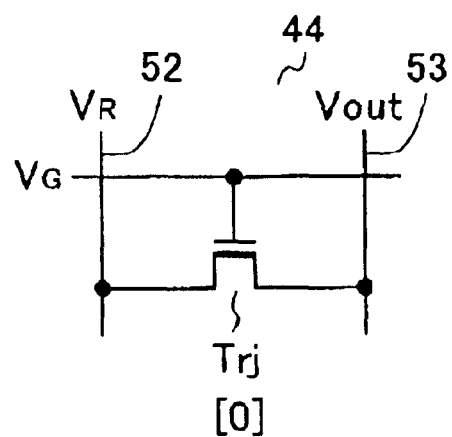

Also, the write-in impurity regions 51a and 51b at the both ends shown in FIGS. 8D and 9D are n-type with phosphorous implanted and therefore, the diode is not formed. Therefore, the corresponding output voltage Vout is outputted from the signal line 53 when the read-out voltage VR is applied to the signal line 52, and the corresponding output voltage Vout is outputted from the signal line 52 when the read-out voltage VR is applied to the signal line 53.

Through the difference of these four patterns, two-bit information is stored.

Figure 10A:
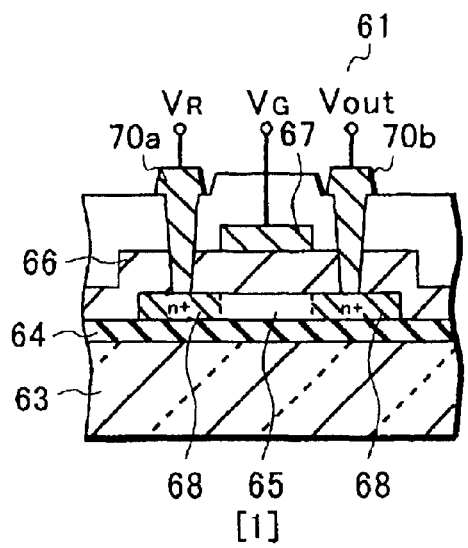
FIGS. 10A and 10B are cross-sectional views of a sixth embodiment of the semiconductor memory element of this invention.
Figure 10B:
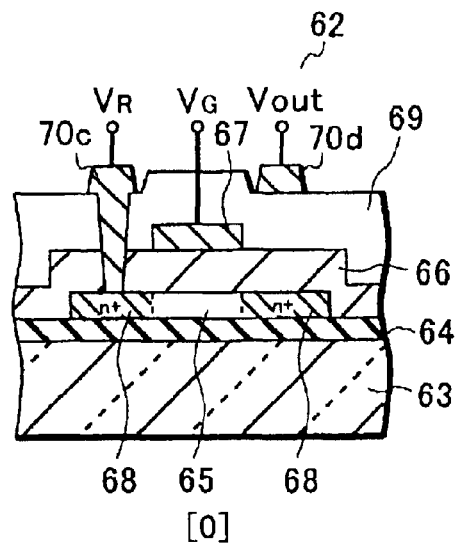
Figure 11A:
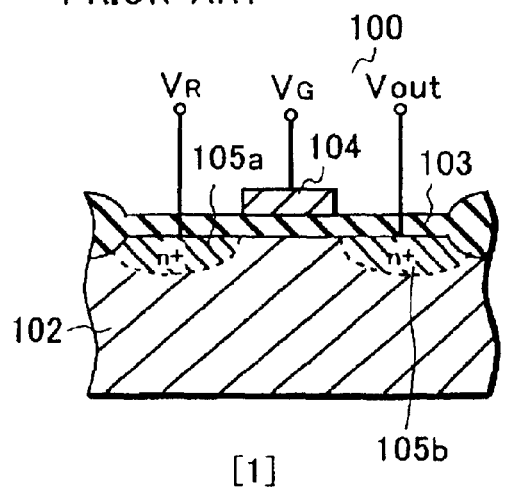
FIGS. 11A and 11B are cross-sectional views of a conventional semiconductor memory element.
Figure 11B:
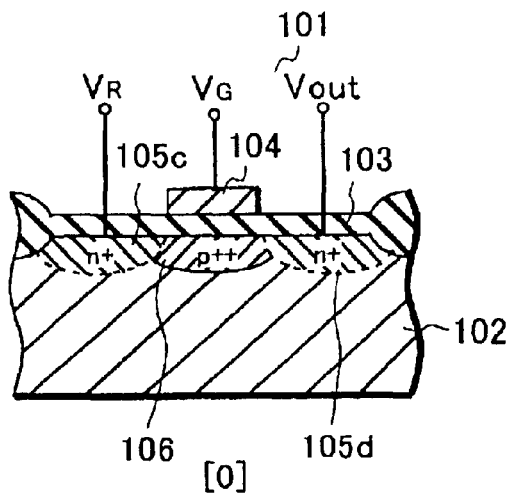

Cross-sectional views of a sixth embodiment of the semiconductor memory element of this invention are shown in FIGS. 10A and 10B. FIG. 10A indicates a memory element 61 with "1" written on it, and FIG. 10B indicates a memory element 62 with "0" written on it. Each of the memory elements 61, 62 of this embodiment has a thin film transistor. The buffer layer 64, the active layer 65 made of polycrystalline silicon, the gate insulating film 66 and the gate electrode 67 are disposed consecutively on the glass substrate 63, completing the thin film transistor. Impurities are implanted into both ends of each of the active layers 65 corresponding to the respective gate electrodes, configuring the impurity region 68. Also, an interlayer insulating film 69 is formed covering the impurity region 68 and the gate electrode 67. A wiring 70 is connected to the impurity region 68 through a contact hole made in the interlayer insulating film 69.

In the memory element 61 with "1" written on it of this embodiment, contact holes are made in both impurity regions 68. The wirings 70 are both conductive to the impurity regions 68. Therefore, the active layer 65 becomes conductive when the gate voltage VG is applied to the gate electrode 67 and the output voltage Vout is outputted to the wiring 70b when the read-out voltage VR is applied to the wiring 70.

In the memory element 62 with "0" written on it, the contact hole corresponding to the wiring 70d is not made. Therefore, wiring 70d and the impurity region 68 are not conductive. Therefore, the output voltage Vout does not change because the read-out voltage VR applied to the wiring 70c is not transmitted to the wiring 70d when the gate voltage VG is applied to the gate electrode 67 and, thus, the active layer 65 becomes conductive.

Next, the manufacturing method of the memory elements 61, 62 of this embodiment will be explained. The buffer layer 64 and the amorphous silicon film are formed by CVD method on the glass substrate 63. Then, the polycrystalline silicon layer is formed by radiating eximer laser to the amorphous silicon film. Then, a predetermined region of the polycrystalline silicon film is removed through etching, forming the active layer 65. Impurities such as boron and arsenic are implanted into the active layer 65, forming the impurity region 68. Next, the gate insulating film 66 covering the active layer 65 is formed through CVD method. Then, metal such as chrome is sputtered to the entire surface, forming a metal film, from which a predetermined area is removed through etching to form the gate electrode 67. Then, the interlayer insulating film 69 is formed through CVD method. Above processes can be used regardless of the program to be written in. Next, according to the program to be written in, contact holes are formed in the interlayer insulating film 69 and the gate insulating film 66 covering one of the impurity regions 68 of the memory element 62, on which one-bit data is not to be written on. Then, a mask is removed and the wiring 70 is finally formed. With above processes, the semiconductor memory device of this embodiment is completed.

In the manufacturing process of the memory element of this embodiment, the implantation of impurity into the active layer is performed before the formation of the gate electrode 66. Therefore, the impurity implantation into the active layer can be properly performed. Also, the semiconductor device, on which all the manufacturing processes from the impurity implantation to the formation of the interlayer insulating film 69 are completed, can be stored, further shortening the TAT. However, the presence of a contact hole can be observed through a magnified view of the semiconductor device. Therefore, when passwords are stored for each of the customers, there is a risk for the password to be decoded from the location of the contact hole. In the first to fifth embodiments described above, information is written in through the impurity implantation. Thus, the stored information can not be decoded from the magnified view. Therefore, when the information such as a password, which should not be decoded, is stored in the mask ROM, the embodiments other than the sixth embodiment are appropriate.

As explained above, the first to sixth embodiments of the semiconductor memory device of this invention can be formed on the glass substrate. The mask ROM can be formed together with a display device or a sensor with TFT array as one unit. Therefore, the manufacturing cost can be lowered compared to the case where the mask ROM is manufactured as an external IC chip and mounted afterwards.

Especially, the memory element has a pair of thin film transistors, making electric current leakage smaller and, thus, reducing power consumption. Therefore, such a memory element is suitable for a portable device. Also, the information is classified based on the difference in the conductivity type of the pair of the thin film transistors, making it impossible for the stored information to be decoded from a magnified view of the device. Thus, this invention is preferred when secret information such as password is stored.

The above is a detailed description of particular embodiments of the invention which are not intended to limit the invention to the embodiments described. It is recognized that modifications within the scope of the invention will occur to a person skilled in the art. Such modifications and equivalents of the invention are intended for inclusion within the scope of this invention.

What is claimed is:

1. A semiconductor memory device including a plurality of memory elements, each memory element comprising:

an active layer;

a pair of thin film transistors each formed at the active layer and each having a corresponding gate electrode and two impurity regions, the four impurity regions being connected so that the thin film transistors in the pair are connected in series, a common gate voltage being applied to the gate electrodes, the pair of thin film transistors together operating as a memory; and a gate insulating film disposed between the active layer and the gate electrodes, wherein the impurity regions are not covered by corresponding gate electrodes.

2. A semiconductor memory device including a plurality of memory elements, each memory element comprising:

an active layer;

a pair of thin film transistors each formed at the active layer and each having a corresponding gate electrode and two impurity regions, the impurity regions of the thin film transistors being connected so that the thin film transistors in the pair are connected in series, a common gate voltage being applied to the gate electrodes; and a gate insulating film disposed between the active layer and the gate electrodes, wherein the memory elements are configured to store a first value when the corresponding pair of thin film transistors of the memory element has a same conductivity type and to store a second value when the corresponding pair of thin film transistors of the memory element has different conductivity types.

3. The semiconductor memory device of claim 1, further comprising a glass substrate, wherein the active layer of the thin film transistors comprises a semiconductor thin film formed on the glass substrate.

4. A semiconductor memory device including a plurality of memory elements, each memory element comprising:

a thin film transistor comprising an active layer, a gate electrode facing the active layer, a gate insulating film disposed between the active layer and the gate electrode, and two impurity regions each formed at a corresponding end of the active layer; and a write-in impurity region disposed adjacent one of the impurity regions and connected to a wiring line for a read out voltage or an output voltage, wherein the memory elements are configured to store a first value when the write-in impurity region of the memory element has a same conductivity type as the corresponding two impurity regions and to store a second value when the write-in impurity region of the memory element has a different conductivity type from the corresponding two impurity regions.

5. The semiconductor memory device of claim 4, further comprising a glass substrate, wherein the active layer of the thin film transistor comprises a semiconductor thin film formed on the glass substrate.

6. A semiconductor memory device including a plurality of memory elements, each memory element comprising:

a thin film transistor comprising an active layer, a gate electrode facing the active layer and a gate insulating film disposed between the active layer and the gate electrode, wherein the memory elements are configured to store a first value when a diode is disposed at one end of the thin film transistor of the memory element and to store a second value when a diode is not disposed at either end of the thin film transistor of the memory element, only one common gate voltage being applied to the gate electrodes.

7. The semiconductor memory device of claim 6, further comprising a glass substrate, wherein the active layer of the thin film transistor comprises a semiconductor thin film formed on the glass substrate.

8. A semiconductor memory device including a plurality of memory elements, each memory element comprising:

a thin film transistor comprising an active layer, a gate electrode facing the active layer and a gate insulating film disposed between the active layer and the gate electrode, wherein the memory elements are configured to store a first value when a first diode is disposed in a normal direction at a first end of the thin film transistor, a second value when a second diode is disposed in a reverse direction at a second end of the thin film transistor, a third value when the first diode is disposed in the normal direction at the first end and the second diode is disposed in the reverse direction at the second end, and a fourth value when no diode is formed at the first and second ends.

9. The semiconductor memory device of claim 8, further comprising a glass substrate, wherein the active layer of the thin film transistor comprises a semiconductor thin film formed on the glass substrate.

10. A semiconductor memory device including a plurality of memory elements, each memory element comprising:

a thin film transistor comprising an active layer, a gate electrode facing the active layer, a gate insulating film disposed between the active layer and the gate electrode, two impurity regions each formed at a corresponding end of the active layer, and a pair of wirings located corresponding to the impurity regions of the thin film transistor, wherein the memory elements are configured to store a first value when both of the two wirings of the memory element are connected to the corresponding impurity regions of the thin film transistor and to store a second value when one of the two wirings of the memory element is not connected to the corresponding impurity region of the thin film transistor.

11. The semiconductor memory device of claim 10, further comprising a glass substrate, wherein the active layer of the thin film transistor comprises a semiconductor thin film formed on the glass substrate.

* * * * *